United States Patent
Giraldo et al.

(10) Patent No.: US 10,348,364 B2
(45) Date of Patent: Jul. 9, 2019

(54) CROSSTALK CORRECTION USING PRE-COMPENSATION

(71) Applicant: Roshmere, Inc., San Diego, CA (US)

(72) Inventors: Eduardo Temprana Giraldo, La Jolla, CA (US); Nikola Alic, La Jolla, CA (US)

(73) Assignee: Roshmere, Inc., San Diego, CA (US)

( * ) Notice: Subject to any disclaimer, the term of this patent is extended or adjusted under 35 U.S.C. 154(b) by 0 days.

(21) Appl. No.: 15/885,091

(22) Filed: Jan. 31, 2018

(65) Prior Publication Data

US 2018/0219578 A1 Aug. 2, 2018

Related U.S. Application Data

(60) Provisional application No. 62/453,387, filed on Feb. 1, 2017.

(51) Int. Cl.
| | |
|---|---|
| H03F 1/32 | (2006.01) |
| H03F 3/24 | (2006.01) |
| H04B 1/04 | (2006.01) |
| H04B 3/32 | (2006.01) |
| H04L 27/00 | (2006.01) |
| H04L 27/01 | (2006.01) |

(52) U.S. Cl.
CPC .............. *H04B 3/32* (2013.01); *H03F 1/3276* (2013.01); *H03F 1/3294* (2013.01); *H03F 3/245* (2013.01); *H04B 1/0475* (2013.01); *H04L 27/0014* (2013.01); *H04L 27/01* (2013.01); *H03F 2201/3209* (2013.01); *H03F 2201/3233* (2013.01)

(58) Field of Classification Search
USPC ........ 375/346, 343, 219, 293; 455/503, 101, 455/502
See application file for complete search history.

(56) References Cited

U.S. PATENT DOCUMENTS

| | | | |
|---|---|---|---|
| 5,311,550 A | 5/1994 | Fouche et al. | |
| 7,706,434 B1 | 4/2010 | Farjadrad et al. | |

(Continued)

FOREIGN PATENT DOCUMENTS

| | | |
|---|---|---|
| WO | 2015062544 A1 | 5/2015 |
| WO | 2016176642 A1 | 11/2016 |

OTHER PUBLICATIONS

International Search Report dated May 10, 2018 for PCT Patent Application Nu. PCT/US2018/016202.

(Continued)

*Primary Examiner* — Wednel Cadeau
(74) *Attorney, Agent, or Firm* — MLO, a professional corp.

(57) ABSTRACT

In a system, known digital representations are generated, and test analog signals are generated using the known digital representations. The test analog signals are transmitted using a transmitter of a transmission system. The test analog signals are received using a receiver of the transmission system and used to generate test received digital representations. The test received digital representations are cross-correlated with the known digital representations to generate a mixing matrix. The mixing matrix is inverted to generate a de-mixing matrix, which is applied to subsequent digital data to be encoded onto a signal and transmitted by the transmitter to generate pre-compensated digital data.

17 Claims, 10 Drawing Sheets

(56) References Cited

U.S. PATENT DOCUMENTS

| | | |
|---|---|---|
| 7,756,421 B2 | 7/2010 | Roberts et al. |
| 7,877,060 B1 | 1/2011 | Khlat et al. |
| 8,909,061 B1 | 12/2014 | Varadarajan |
| 9,166,828 B1 | 10/2015 | Nabar et al. |
| 9,525,475 B1* | 12/2016 | Gan .................. H04B 1/082 |
| 10,110,263 B2 | 10/2018 | Giraldo et al. |
| 2002/0122503 A1 | 9/2002 | Agazzi |
| 2003/0112164 A1 | 6/2003 | Scanlan et al. |
| 2005/0118963 A1 | 6/2005 | Chiu |
| 2005/0169393 A1 | 8/2005 | Lozhkin et al. |
| 2008/0025381 A1 | 1/2008 | Lee et al. |
| 2012/0105262 A1 | 5/2012 | Rao et al. |
| 2014/0363173 A1 | 12/2014 | Dave et al. |
| 2015/0071390 A1* | 3/2015 | Muhammad ............ H04B 1/10 375/346 |
| 2015/0295643 A1 | 10/2015 | Zhao et al. |
| 2016/0080091 A1 | 3/2016 | Thesling |
| 2016/0094296 A1 | 3/2016 | Hongou |
| 2016/0105251 A1 | 4/2016 | Cheng |
| 2016/0241341 A1* | 8/2016 | Endo ................ H04B 10/50 |

OTHER PUBLICATIONS

International Search Report dated May 31, 2018 for PCT Patent Application Nu. PCT/US2018/016113.
Notice of Allowance dated Jun. 20, 2018 for U.S. Appl. No. 15/884,182.
Office Action dated Apr. 19, 2018 for U.S. Appl. No. 15/884,182.
Notice of Allowance dated Feb. 26, 2019 for U.S. Appl. No. 16/160,287.

\* cited by examiner

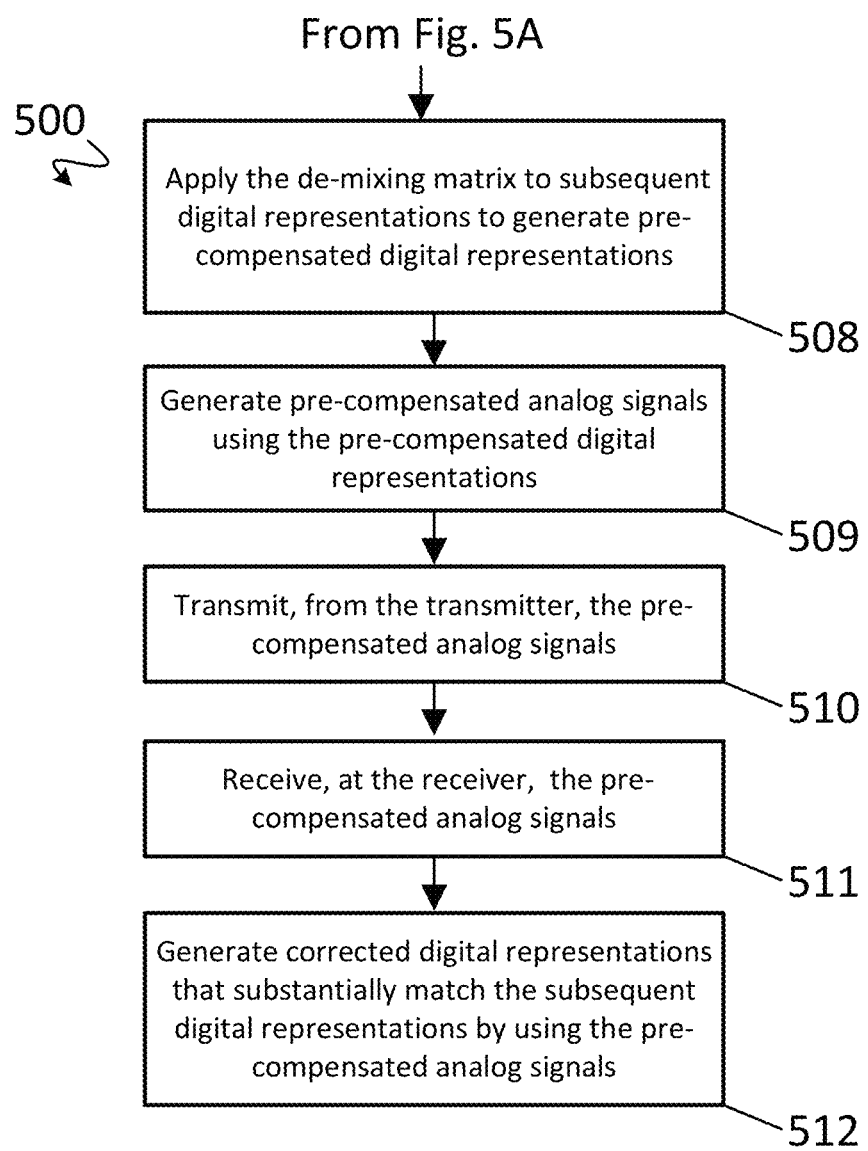

CROSSTALK CORRECTION USING PRE-COMPENSATION

RELATED APPLICATIONS

The application claims the benefit of U.S. Provisional Patent Application No. 62/453,387 filed on Feb. 1, 2017, and entitled "CROSSTALK AND POWER-IMBALANCE CORRECTION USING PRE-COMPENSATION;" which is hereby incorporated by reference for all purposes.

BACKGROUND OF THE INVENTION

Modern fiber optic transmission systems are based on a polarization-multiplexed, wavelength-division multiplex architecture thus taking advantage of all four degrees of freedom of the optical field. The optical field is, from a mathematical perspective, a complex quantity having real and imaginary components (sometimes referred to as in-phase and quadrature components (IQ), respectively). The two optical field components are mutually orthogonal, which in mathematical terms, signifies extreme dissimilarity, or independence. In addition to the complex characteristics of the optical field, the optical field can exist in two orthogonal polarizations, that, too, are altogether dissimilar. Thus, an ideal optical field has four orthogonal components in total.

Ideally, sending information imprinted (e.g. modulated) onto the four orthogonal components of an optical field is equivalent to sending information over four independent channels, thus providing means for increasing the density of information that can be transmitted by an optical field by a four-fold.

Unfortunately, the (ideally) independent information channels of an optical field often mix, or couple, with each other due to loss of polarization orthogonality and imbalances in power between the polarizations in the modulation process. This results in degraded performance of the optical transmission system.

In practice, strict orthogonality between the polarizations is difficult to realize—especially orthogonality of the polarization in components used for modulation of the optical field. One cause of the loss of orthogonality between the polarizations includes crosstalk between optical modulator electrodes used for modulating the respective polarizations, as crosstalk introduces similarities across the polarizations.

Equal power balance between the two polarizations is also difficult to realize. This is especially problematic as modern optical transmission systems are designed to transmit ("launch") using equal power in the two polarizations, and digital processing methods for later polarization de-coupling at a receiver often rely on the assumption of equal power launch for each of the two polarizations. In practice, the power in the two polarizations, even at the transmitter, is rarely equal due to the unequal power split between the polarization modulation branches, or possibly polarization dependent loss of the involved components. The latter combination of effects leads to an irreversible penalty, which, owing to the nonlinear response of the modulator and possibly other elements in the system, cannot be reversed (or undone) at the receiving end of the link. Consequently, owing to the non-ideal characteristics of the components in the realization, optical dual-polarization transmission systems do not operate to their full potential. Specifically, degradation by more than 3 dB is a common occurrence in these systems.

Some methods attempt to correct the polarization signals at the receiving end of the transmission link, but still suffer a significant penalty with respect to theoretical predictions (assuming signal modulation in orthogonal polarizations). Other solutions attempt to improve signal generation quality at the transmitter by attempting to equalize (adjust) each of the four modulation streams independently during the modulation process by some means of pre-compensation, but these solutions still have a residual error in attainable fidelity.

SUMMARY OF INVENTION

In some embodiments, a method is disclosed for using pre-compensation to reduce, mitigate or eliminate ("correct") the effects of crosstalk and polarization power-imbalances in dual-polarization transmission systems.

In some embodiments, a transmission system is provided comprising a transmitter, a transmission channel, and a receiver. Two carrier signals, and a first and a second test known digital representations, are also provided. A first and second analog modulated test signals are generated by modulating the first and second test known digital representations onto the two carrier signals in the transmitter. The first and second modulated test signals are transmitted by the transmitter over the transmission channel. The first and second modulated test signals affected by crosstalk distortions are received by the receiver. The received first and second modulated test signals are down-converted into first and second test received digital representations. The first and second test received digital representations are cross-correlated with the first and second test known digital representations to generate a mixing matrix, wherein the mixing matrix describes the crosstalk between the first and second test received digital representations. The mixing matrix is inverted to generate a de-mixing matrix that is subsequently used for pre-compensation of the (polarization) crosstalk in the generation of the digital representations of the two signals. The method additionally includes, providing digital data to be encoded onto a signal and transmitted by the transmitter, and pre-compensating the digital data using the de-mixing matrix in the transmitter.

In some embodiments, the method above further comprises generating an encoded signal by encoding the digital data onto the signal, and transmitting the encoded signal by the transmitter. The transmitted encoded signal is affected by one or more nonlinear distortions with memory effects, and the one or more nonlinear distortions are corrected using a nonlinear distortion correction system.

In some embodiments, one or more systems carry out one or more steps of a method that involves performing a pre-compensation method for a transmission system in which a first optical carrier signal is generated and split into first and second test polarized signals that are orthogonal to each other and that have in-phase and quadrature components. Known digital representations ($X_{gen}$ and $Y_{gen}$) of test excitation signals are generated, each having an in-phase and quadrature representation. Test modulation analog signals are generated from the known digital representations ($X_{gen}$ and $Y_{gen}$). The in-phase and quadrature components of the first and second test polarized signals are modulated with the test modulation analog signals to form first and second modulated test polarized signals. The first and second modulated test polarized signals are combined to generate a test dual-polarization signal, which is transmitted at one point and received at another. The received test dual-polarization signal is split into first and second received test polarized signals. The first and second received test polarized signals are demodulated to generate demodulated test analog signals. The demodulated test analog signals are demodulated to generate test received digital representations ($X_{rec}$ and $Y_{rec}$). The test received digital representations ($X_{rec}$ and $Y_{rec}$) are cross-correlated with the known digital representations ($X_{gen}$ and $Y_{gen}$) to generate a mixing matrix. The mixing matrix is inverted to generate a de-mixing matrix. The method also involves transmitting data by the transmission system in which a second optical carrier signal is generated and split into first and second data polarized signals that are orthogonal to each other and that have in-phase and quadrature components. Subsequent digital representations ($X_{sub}$ and $Y_{sub}$) of data analog signals are generated from data that is to be transmitted. The de-mixing matrix is applied to the subsequent digital representations ($X_{sub}$ and $Y_{sub}$) to generate pre-compensated digital representations ($X_{pre-comp}$ and $Y_{pre-comp}$). Pre-compensated modulation analog signals are generated from the pre-compensated digital representations ($X_{pre-comp}$ and $Y_{pre-comp}$). The in-phase and quadrature components of the first and second data polarized signals are modulated with the pre-compensated modulation analog signals to form first and second modulated pre-compensated polarized signals. The first and second modulated pre-compensated polarized signals are combined to generate a pre-compensated dual-polarization signal. The pre-compensated dual-polarization signal is transmitted at one point and received at another. The received pre-compensated dual-polarization signal is split into first and second received pre-compensated polarized signals. The first and second received pre-compensated polarized signals are demodulated to generate demodulated corrected analog signals. The demodulated corrected analog signals are digitized to generate corrected received digital representations ($X_{cor}$ and where the $Y_{cor}$), corrected received digital representations ($X_{cor}$ and $Y_{cor}$) substantially match the subsequent digital representations ($X_{sub}$ and $Y_{sub}$). The data to be transmitted is retrieved from the corrected received digital representations ($X_{cor}$ and $Y_{cor}$).

BRIEF DESCRIPTION OF THE DRAWINGS

FIG. 5B provides a portion of an example process for power-imbalance and crosstalk-correction, in accordance with one or more example embodiments.

DETAILED DESCRIPTION OF THE EMBODIMENTS

Generating dual-polarized signals, having strictly orthogonal polarizations and with equal power in both polarizations, is of critical importance in optical transmission systems. In some example embodiments, the performance of polarization multiplexed optical transmission systems is improved by ensuring orthogonality between the polarization components, and by reducing (or eliminating) polarization crosstalk, as well as correcting for power-imbalance, through system characterization to generate polarization coupling coefficients. In some embodiments, nonlinear distortions (e.g., caused by the optical modulator and/or the modulator-driver-amplifier) is corrected in addition to the polarization crosstalk. An inversion of these coupling coefficients is used for subsequent transmissions to pre-compensate the subsequent transmission signals, thereby negating or counteracting ("correcting") the effects of crosstalk and polarization power-imbalance resulting from transmission.

Figure 1:
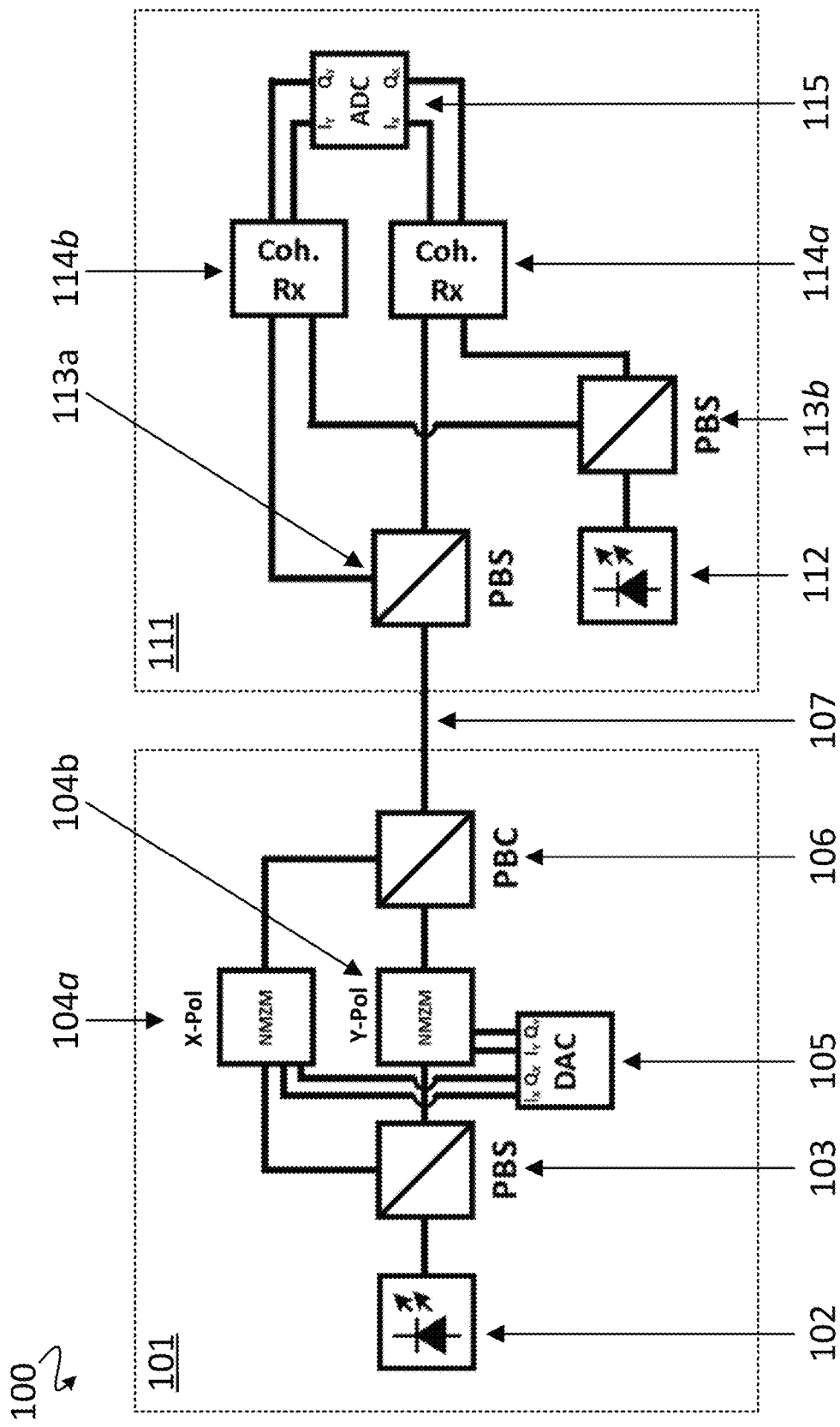
FIG. 1 is a simplified schematic diagram of a prior art dual-polarization optical transmission system.

FIG. 1 shows a simplified schematic diagram of a prior art dual-polarization optical transmission system 100. Some elements are omitted for ease of illustration and explanation.

The system 100 includes a transmitter portion ("transmitter") 101 and a receiver portion ("receiver") 111. The transmitter 101 generally includes a laser source 102, a polarization beam splitter (PBS) 103, two (nested) Mach-Zehnder modulators (NMZMs) 104a-b, a digital-to-analog converter (DAC) 105, and a polarization beam combiner 106, among other components not shown for simplicity. Additionally, in some embodiments, some of the functions described for the components 102 through 106 are implemented in other components, either shown or not shown.

The laser source 102 is used to generate a carrier signal that includes two orthogonal polarizations, e.g. an X-polarization and a Y-polarization. The PBS 103 splits the carrier signal into two carrier signals, each having a respective orthogonal polarization. The X-polarized carrier signal is received at the NMZM 104a, and the Y-polarized signal is received at the NMZM 104b. The DAC 105 converts four respective digital representations of information (not shown) into two in-phase-and-quadrature (IQ) analog signals (IxQx and $I_y Q_y$), each having an amplitude component (I) and a quadrature component (Q).

The NMZM 104a imprints (e.g. modulates) the analog signals $I_X$ and $Q_X$ onto the X-polarized carrier signal to generate a X-polarized quadrature-amplitude modulation (QAM) modulated signal, and the NMZM 104b imprints the analog signals $I_Y$ and $Q_Y$ onto the Y-polarized carrier signal to generate a Y-polarized QAM modulated signal. At the PBC 106, the X-polarized QAM modulated signal and the Y-polarized QAM modulated signal are combined to generate a dual-polarization transmission signal. The dual-polarization transmission signal is then transmitted to the receiver 111 over a transmission link 107. In other embodiments, the modulation scheme can be QAM, or a different modulation scheme, without deviating from the systems and methods concepts described herein.

The receiver 111 generally includes a laser source 112, PBSs 113a-b, coherent receivers 114a-b, and an analog-to-digital converter (ADC) 115, among other components not shown for simplicity.

The receiver 111 receives the dual-polarization transmission signal from the transmission link 107. The PBS 113a splits the received dual-polarization transmission signal into a received X-polarized QAM modulated signal and a received Y-polarized QAM modulated signal.

The laser source 112 provides a local oscillation signal that includes two orthogonal polarizations, e.g. an X-polarization and a Y-polarization. The PBS 113b splits the local oscillation signal into local oscillation signals, each having an orthogonal polarization. The X-polarized oscillation signal and the X-polarized QAM modulated signal are received at the coherent receiver 114a, and the Y-polarized oscillation signal and the Y-polarized QAM modulated signal are received at the coherent receiver 114b.

The coherent receivers 114a-b use the respective oscillation signals for down-conversion of the respective polarized QAM modulated signals to generate four respective analog signals, $I_X$, $Q_X$ and $I_Y$, $Q_Y$. The ADC 115 then converts the analog signals $I_X$, $Q_X$, and $I_Y$, $Q_Y$ into four respective digital representations of (all or a portion of) the transmitted information.

Crosstalk between signals can occur anywhere that the signals cross and/or interact with one another. Some examples of system components where signals can cross and/or interact are in a multichannel DAC, NMZM, PBS, and within a transmission channel (e.g., a fiber-optic channel).

In the system illustrated in FIG. 1, crosstalk can occur at a number of places. For example, in practice, the PBS 103 will not perfectly separate the two polarizations of the carrier beam from the laser source, and therefore some of the X-polarized carrier beam will enter the NMZM 104b for the Y-polarization and some of the Y-polarized carrier beam will enter the NMZM 104a for the X-polarization. This will cause some degree of crosstalk because the signal imprinted on the X-polarization in the NMZM 104a will also be imprinted on the fraction of the Y-polarization that was not properly directed by the PBS 103. Similarly, the signal imprinted on the Y-polarization in the NMZM 104b will also be imprinted on a fraction of the X-polarization that was not properly directed by the PBS.

Another example of a cause for crosstalk is crosstalk between channels of a multichannel DAC. The DAC 105 in FIG. 1, for example, has four channels for encoding signals on the two different polarizations and the two in-phase-and-quadrature components for each polarization. Crosstalk between the DAC channels will therefore cause some degree of crosstalk between the optical signals. For example, the signal imprinted on the in-phase component of the X-polarization in the NMZM 104a can also be imprinted on the quadrature component of the X-polarization, and/or on one or both components of the Y-polarization due to crosstalk between the channels of the DAC 105, which control the NMZMs 104a and 104b.

Figure 2A:
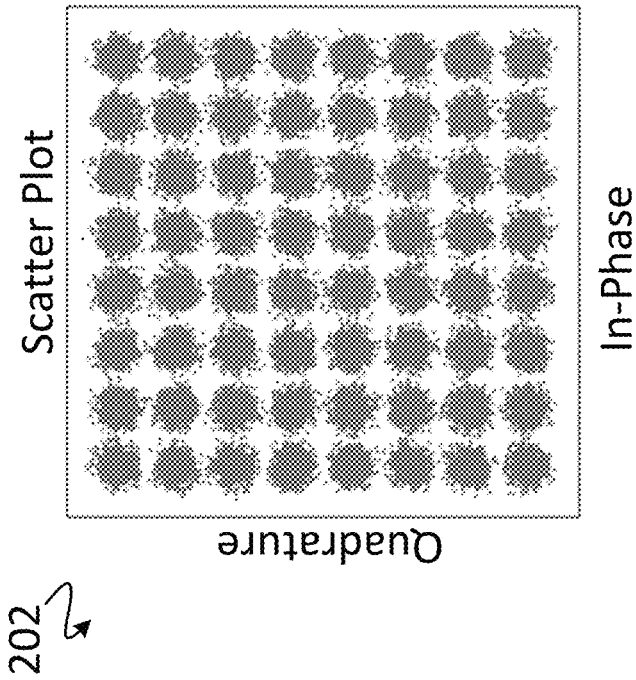
FIG. 2A shows a simplified constellation diagram corresponding to a polarized signal that is unaffected by power-imbalance and crosstalk.

FIG. 2A shows a simplified constellation diagram 201 corresponding to a polarized signal that is unaffected by power-imbalance and crosstalk (the constellation diagram is substantially square and evenly-spaced). A constellation diagram is a two-dimensional scatter plot, in the X-Y plane, that represents a signal which has been modulated using modulation techniques such as phase-shift keying (PSK) or quadrature-amplitude modulation (QAM). In the example shown, the simplified constellation diagram 201 corresponds to a received X-polarized 64-QAM modulated signal. The x-axis of the constellation diagram corresponds to the in-phase component of the X-polarized QAM modulated signal ($I_x$), and the y-axis of the constellation diagram corresponds to the quadrature component ($Q_x$) of the X-polarized QAM modulated signal. The constellation points of a constellation diagram are often arranged in a square grid with equal vertical and horizontal spacing. As constellation points become closer together, the transmission system becomes more susceptible to noise and other impairments.

Figure 2B:
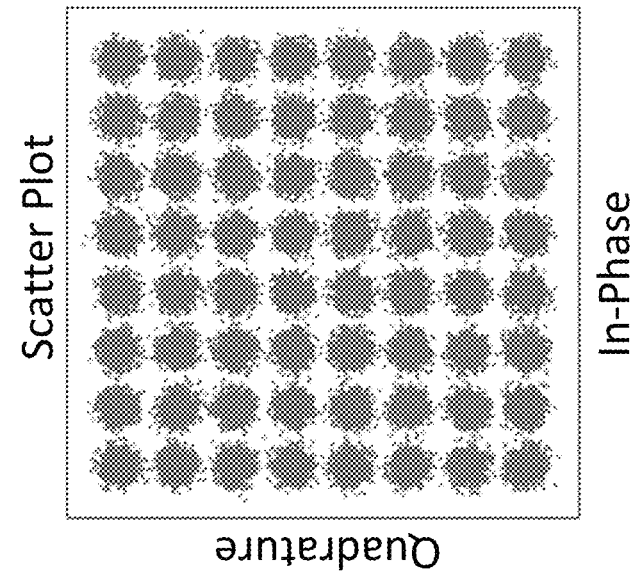
FIG. 2B shows a simplified constellation diagram corresponding to another polarized signal that is unaffected by power-imbalance and crosstalk.

FIG. 2B shows a simplified constellation diagram 202 corresponding to another polarized signal that is unaffected by power-imbalance and crosstalk. In the example shown, the simplified constellation diagram 202 corresponds to a received Y-polarized 64-QAM modulated signal. The x-axis of the constellation diagram corresponds to the in-phase component of the Y-polarized QAM modulated signal ($I_Y$), and the y-axis of the constellation diagram corresponds to the quadrature component ($Q_Y$) of the Y-polarized QAM modulated signal.

Figure 3B:
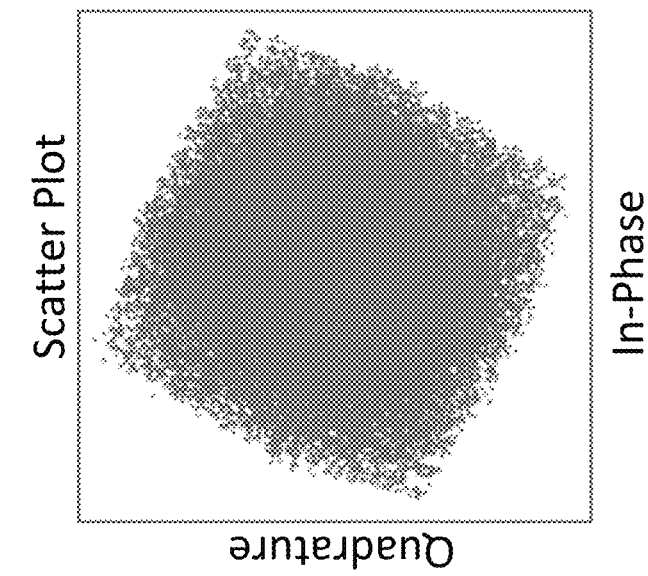
FIG. 3B shows a simplified constellation diagram corresponding to another polarized signal before correction.
Figure 3A:
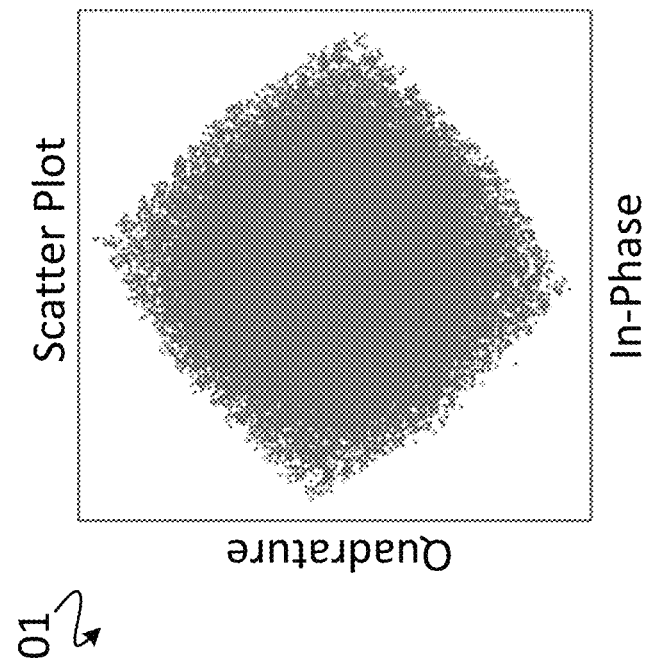
FIG. 3A shows a simplified constellation diagram corresponding to a polarized signal before correction.

FIG. 3A shows a simplified constellation diagram 301 corresponding to a polarized signal before power-imbalance and crosstalk correction. In the example shown, the simplified constellation diagram 301 corresponds to a received X-polarized 64-QAM modulated signal that has been affected by crosstalk and/or power-imbalance with memory effects. In this context, memory effects are distortions that occur between different sampled instances in time, and not just instantaneously. The x-axis of the constellation diagram corresponds to the in-phase component of the X-polarized QAM modulated signal ($I_X$), and the y-axis of the constellation diagram corresponds to the quadrature component ($Q_X$) of the X-polarized QAM modulated signal.

As shown, the effects of crosstalk and power-imbalance on the X-polarized QAM modulated signal introduce significant warping of the constellation diagram. This results in a momentous departure from the square shape shown in the constellation diagram 201. Because of this warping, the constellation points are no longer arranged with equal vertical and horizontal spacing. As was discussed with respect to FIG. 2A, the transmission system will thus be more susceptible to noise and other impairments.

FIG. 3B shows a simplified constellation diagram 302 corresponding to another polarized signal before power-imbalance and crosstalk correction. In the example shown, the simplified constellation diagram 302 corresponds to a received Y-polarized 64-QAM modulated signal that has been affected by crosstalk and/or power-imbalance with memory effects. The x-axis of the constellation diagram corresponds to the in-phase component of the Y-polarized QAM modulated signal ($I_Y$), and the y-axis of the constellation diagram corresponds to the quadrature component ($Q_Y$) of the Y-polarized QAM modulated signal. Similar to the constellation diagram 301, the constellation diagram 302 departs substantially from a square shape with equal vertical and horizontal spacing.

Figure 4:
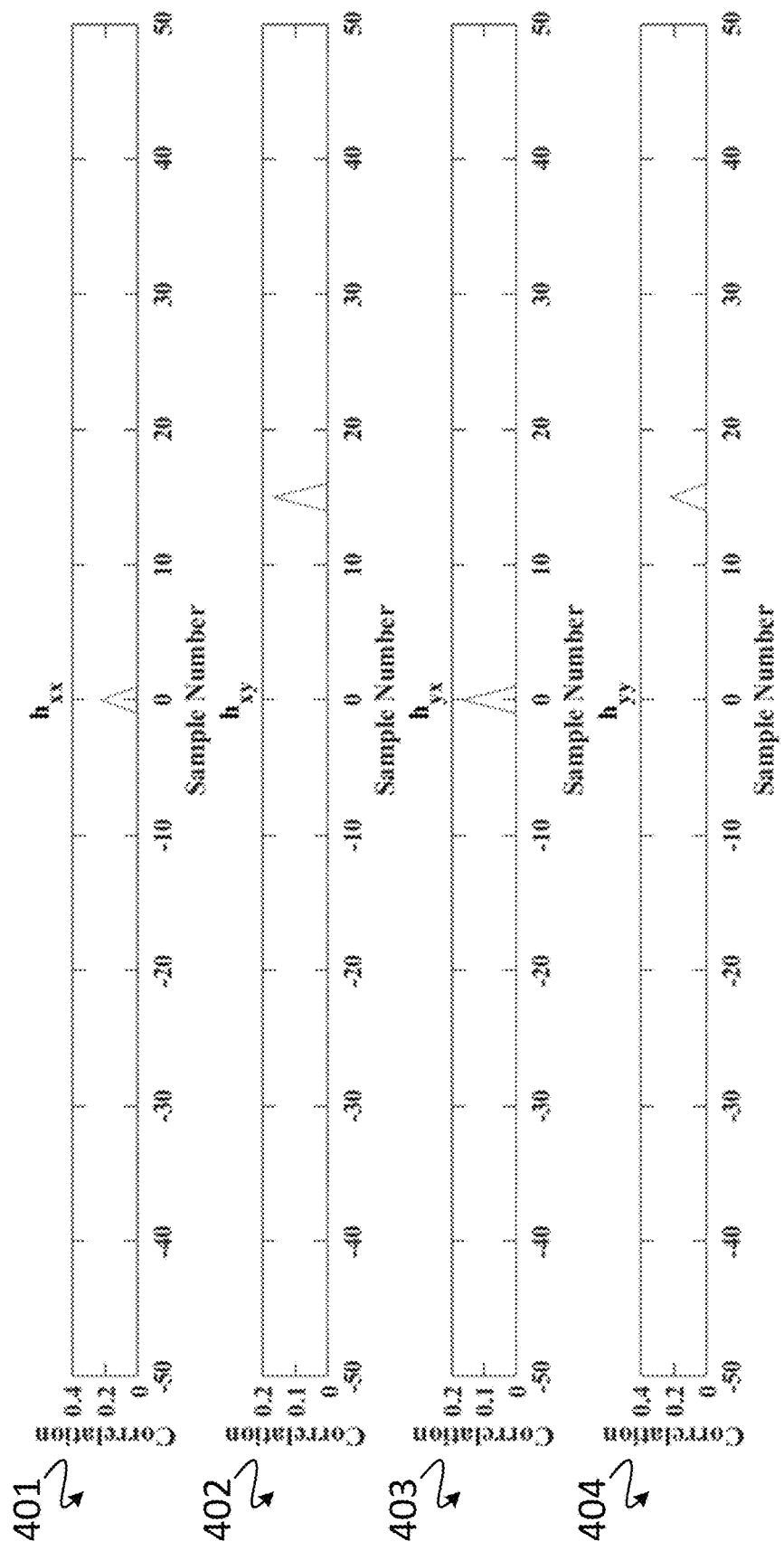
FIG. 4 shows simplified graphs of cross-correlations between generated and received digital representations before correction.

FIG. 4 shows simplified graphs 401 through 404 of cross-correlations between generated and received digital representations of X and Y polarized signals before correction. In the example shown in FIG. 4, known digital representations ($X_{gen}$ and $Y_{gen}$) of test excitation signals are generated, each having an in-phase and quadrature representation. Test modulation analog signals are generated from the known digital representations ($X_{gen}$ and $Y_{gen}$). For example, the known digital representations ($X_{gen}$ and $Y_{gen}$) can be similar to the simplified constellation diagrams 201 and 202 (shown in FIGS. 2A and 2B). The in-phase and quadrature components of the first and second test polarized signals are modulated with the test modulation analog signals to form first and second modulated test polarized signals. The first and second modulated test polarized signals are combined to generate a test dual-polarization signal, which is transmitted at one point and received at another. The received test dual-polarization signal is split into first and second received test polarized signals. The first and second received test polarized signals are demodulated to generate demodulated test analog signals. The demodulated test analog signals are demodulated to generate test received digital representations ($X_{rec}$ and $Y_{rec}$). For example, test received digital representations ($X_{rec}$ and $Y_{rec}$) can be similar to the simplified constellation diagrams 301 and 302 (shown in FIGS. 3A and 3B). The test received digital representations ($X_{rec}$ and $Y_{rec}$) are cross-correlated with the known digital representations ($X_{gen}$ and $Y_{gen}$). The simplified constellation diagrams 301 and 302 in FIGS. 3A and 3B are affected by the crosstalk with memory effects that are described by the cross-correlations shown in simplified graphs 401 through 404 in FIG. 4.

Graph 401 shows an excerpt of a cross-correlation $h_{xx}$ between the digital representation $X_{rec}$ of a received first analog signal (that was transmitted using an X-polarized carrier signal) and the digital representation $X_{gen}$ of the first analog signal. Graph 402 shows an excerpt of a cross-correlation $h_{xy}$ between the digital representation $X_{rec}$ and the digital representation $Y_{gen}$ of a second analog signal. Graph 403 shows an excerpt of a cross-correlation $h_{yx}$ between the received digital representation $Y_{rec}$ of the second analog signal (that was transmitted using a Y-polarized carrier signal) and the digital representation $X_{gen}$ of the first analog signal. Graph 404 shows an excerpt of a cross-correlation $h_{yy}$ between the digital representation $Y_{rec}$ and the digital representation $Y_{gen}$. In this example, the cross-correlations ($h_{xx}$, $h_{xy}$, $h_{yx}$ and $h_{yy}$) are vectors to account for the fact that the crosstalk and the cross-correlations include memory effects. The x-axes of the plots 401, 402, 403 and 404 are Sample Numbers, which in some embodiments, are taps from a finite impulse response (FIR) filter. In this example, $h_{xy}$ and $h_{yy}$ are delayed (i.e., the non-zero correlation occurs at about Sample Number 15) due to optical path length mismatch.

As shown, due to impairments caused by crosstalk and power-imbalances, the X-polarized carrier signal and the Y-polarized carrier signal are not strictly orthogonal. This is evident as there is a non-zero amplitude cross-correlation between the orthogonal carriers shown in graph 402 (close to sample 15) and in graph 403 (close to sample 0). If the X-polarized carrier signal and the Y-polarized carrier signal were strictly orthogonal, there would be no similarities between ($X_{rec}$, $Y_{gen}$) and ($Y_{rec}$, $X_{gen}$), resulting in subsequent cross-correlations having zero (or little) amplitude.

The effects of cross-talk and power-imbalances causes mixing between the X and Y polarized analog signals. That is, a portion of the Y-polarized signal is present in the received X-polarized signal. Thus, $X_{rec}$ does not equal $X_{gen}$ (as it would in an ideal transmission system). Likewise, because a portion of the X-polarized signal is present in the received Y-polarized signal, $Y_{rec}$ does not equal $Y_{gen}$. Rather, these signals relate as:

$$X_{rec} = a \cdot X_{gen} + b \cdot Y_{gen}, \quad \text{(Equation 1)}$$

and $$Y_{rec} = C \cdot X_{gen} + d \cdot Y_{gen}, \quad \text{(Equation 2)}$$

where coupling coefficients a, b, c and d are indicative of the degree to which each of the respective generated signals, $X_{gen}$ and $Y_{gen}$, is present in the respective received signals, $X_{rec}$ and $Y_{rec}$. In this case the coupling coefficients a, b, c and d are scalar quantities, describing instantaneous distortions (i.e., without memory effects). In other embodiments, crosstalk and/or power imbalance distortions with memory effects can also occur, and be corrected for using similar methods as described herein. In the case of correcting crosstalk and/or power imbalance distortions with memory effects, the form of the equations described herein would be the same, except they would include additional dimensions to account for the memory effects. Equation 1 and equation 2 can be expressed in matrix form as:

$$\begin{bmatrix} X_{rec} \\ Y_{rec} \end{bmatrix} = \begin{bmatrix} a & b \\ c & d \end{bmatrix} \begin{bmatrix} X_{gen} \\ Y_{gen} \end{bmatrix}, \quad \text{(Equation 3)}$$

and for simplicity, the coupling coefficients a through d can be written as a mixing matrix T of the form:

$$T = \begin{bmatrix} a & b \\ c & d \end{bmatrix}. \quad \text{(Equation 4)}$$

Thus, equation 3 can also be expressed as:

$$\begin{bmatrix} X_{rec} \\ Y_{rec} \end{bmatrix} = T \begin{bmatrix} X_{gen} \\ Y_{gen} \end{bmatrix}. \quad \text{(Equation 5)}$$

Example embodiments directed to performing a test for correcting (e.g. reducing, mitigating or eliminating) the effects of crosstalk and power-imbalances and then transmitting data according to the disclosed power-imbalance and crosstalk-correction pre-compensation technique in dual-polarization optical transmission systems are discussed next.

Figure 5A:
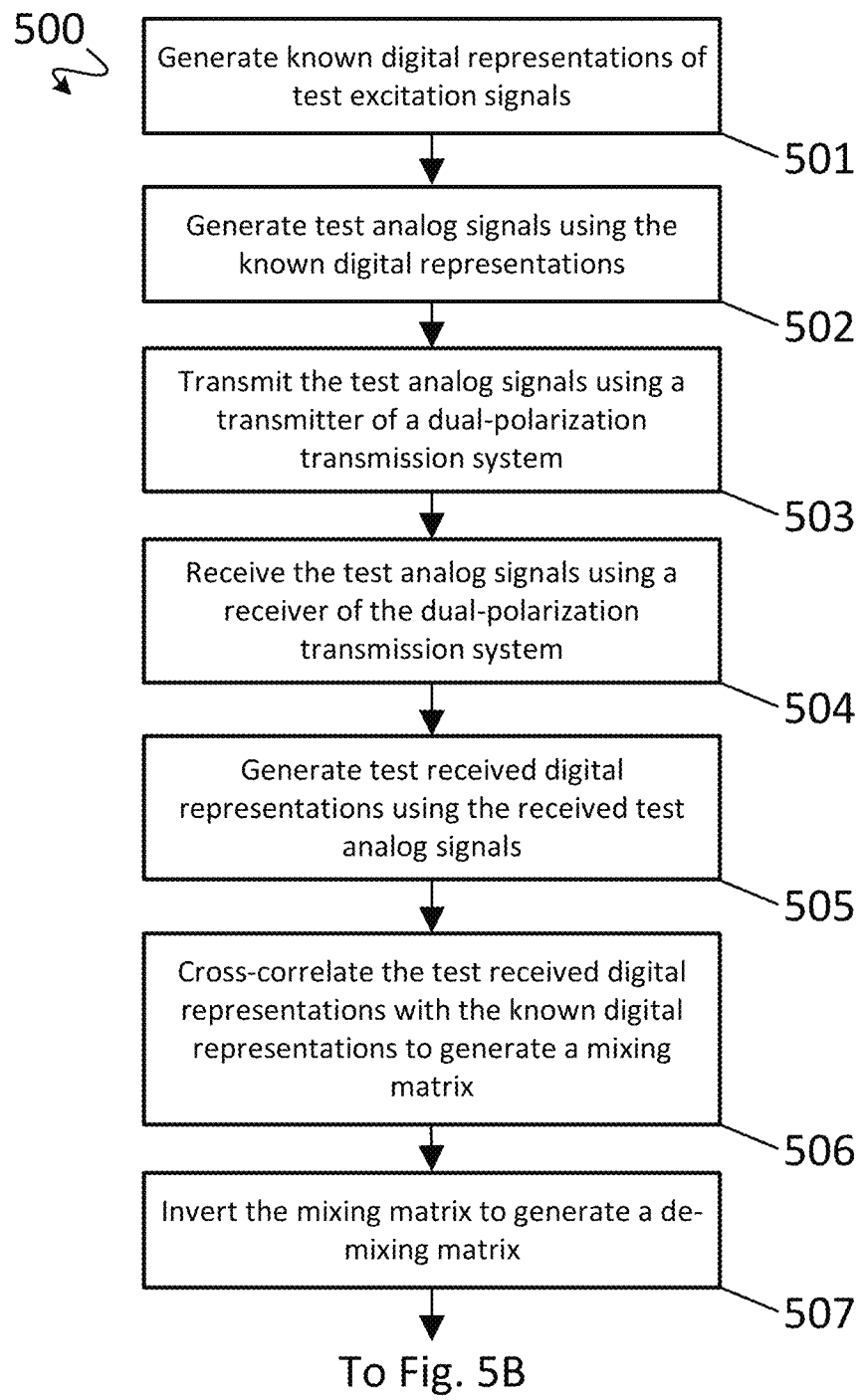
FIG. 5A provides a portion of an example process for power-imbalance and crosstalk-correction, in accordance with one or more example embodiments.

FIG. 5A provides a portion of an example process 500 for power-imbalance and crosstalk-correction ("correction") by performing a test to generate a de-mixing matrix, in accordance with one or more example embodiments. At step 501, known digital representations of test excitation signals are generated. In some embodiments, this step includes generating known digital representations ($X_{gen}$ and $Y_{gen}$) of test excitation signals (ideal analog signals for the digital representations). Next, at step 502, test analog signals are generated using the known digital representations. In some embodiments, this step includes generating test modulation analog signals (e.g. actual (non-ideal) analog signals for the digital representations) from the known digital representations ($X_{gen}$ and $Y_{gen}$). Then, at step 503, the test analog signals are transmitted using a transmitter of a dual-polarization transmission system. In some embodiments, this step includes generating a first optical carrier signal, splitting the first optical carrier signal into first and second test polarized signals (for performing a test in order to generate a de-mixing matrix) that are orthogonal to each other and that have in-phase and quadrature components, modulating the in-phase and quadrature components of the first and second test polarized signals with the test modulation analog signals to form first and second modulated test polarized signals (also used for performing the test to generate the de-mixing matrix), combining the first and second modulated test polarized signals to generate a test dual-polarization signal, and transmitting the test dual-polarization signal.

At step 504, the test analog signals are received using a receiver of the dual-polarization transmission system. In some embodiments, this step includes receiving the test dual-polarization signal. Next, at step 505, test received digital representations are generated using the received test analog signals. In some embodiments, this step includes splitting the test dual-polarization signal into first and second received test polarized signals, demodulating the first and second received test polarized signals to generate demodulated test analog signals, and digitizing the demodulated test analog signals to generate test received digital representations ($X_{rec}$ and $Y_{rec}$).

Then, at step 506, the test received digital representations are cross-correlated with the known digital representations (e.g. as shown in FIG. 4) to generate a mixing matrix (e.g. the matrix T as shown in equation 4). In some embodiments, this step includes cross-correlating the test received digital representations ($X_{rec}$ and $Y_{rec}$) with the known digital representations ($X_{gen}$ and $Y_{gen}$) to generate the mixing matrix.

At step 507, the mixing matrix is inverted to generate a de-mixing matrix. Given a mixing matrix T, of equation 4, a de-mixing matrix D is expressed as:

$$D = T^{-1}. \quad \text{(Equation 6)}$$

FIG. 5B provides a portion of the example process 500 for power-imbalance and crosstalk-correction ("correction") to transmit data, in accordance with one or more example embodiments. In some embodiments, step 508 of FIG. 5B occurs directly after step 507 of FIG. 5A. In some embodiments, step 508 occurs substantially later after step 507. In some embodiments, the de-mixing matrix is stored (e.g., in memory storage, or registers) after step 507 and retrieved (e.g., from memory storage, or registers) before step 508.

At step 508, the de-mixing matrix is applied to subsequent digital representations to generate pre-compensated digital representations. In some embodiments, this step includes generating, from data to be transmitted, subsequent digital representations ($X_{sub}$ and $Y_{sub}$) of data analog signals (ideal signals for transmitting data if there was no crosstalk or power-imbalance), and applying the de-mixing matrix to the subsequent digital representations ($X_{sub}$ and $Y_{sub}$) to generate pre-compensated digital representations ($X_{pre-comp}$ and $Y_{pre-comp}$). Generation of the pre-compensated digital representations using the de-mixing matrix can be expressed as the matrix operation:

$$\begin{bmatrix} X_{pre-comp} \\ Y_{pre-comp} \end{bmatrix} = D \begin{bmatrix} X_{sub} \\ Y_{sub} \end{bmatrix}. \quad \text{(Equation 7)}$$

Next, at step 509, pre-compensated analog signals are generated using the pre-compensated digital representations. In some embodiments, this step includes generating pre-compensated modulation analog signals (e.g. actual (non-ideal) signals to be used for transmitting the data) from the pre-compensated digital representations ($X_{pre-comp}$ and $Y_{pre-comp}$).

Then, at step 510, the pre-compensated analog signals are transmitted using the transmitter of the dual-polarization transmission system. In some embodiments, this step includes generating a second optical carrier signal, splitting the second optical carrier signal into first and second data polarized signals (to be used to transmit data under operating conditions for the transmission system) that are orthogonal to each other and that have in-phase and quadrature components, modulating the in-phase and quadrature components of the first and second data polarized signals with the pre-compensated modulation analog signals to form first and second modulated pre-compensated polarized signals (actual signals that transmit the data under operating conditions, but with power-imbalance and crosstalk mitigation), combining the first and second modulated pre-compensated polarized signals to generate a pre-compensated dual-polarization signal, and transmitting the pre-compensated dual-polarization signal.

At step 511, the pre-compensated dual-polarization analog signals are received at the receiver. Then, at step 512, corrected digital representations that substantially match the subsequent digital representations are generated by using the pre-compensated analog signals. In some embodiments, this step includes splitting the pre-compensated dual-polarization signal into first and second received pre-compensated polarized signals, demodulating the first and second received pre-compensated polarized signals to generate demodulated corrected analog signals, and digitizing the demodulated corrected analog signals to generate corrected received digital representations ($X_{cor}$ and $Y_{cor}$), where the corrected received digital representations ($X_{cor}$ and $Y_{cor}$) substantially match the subsequent digital representations ($X_{sub}$ and $Y_{sub}$), and retrieving the data to be transmitted from the corrected received digital representations ($X_{cor}$ and $Y_{cor}$).

Correction using the pre-compensated values generated using the de-mixing matrix D can be expressed as:

$$\begin{bmatrix} X_{cor} \\ Y_{cor} \end{bmatrix} = TD \begin{bmatrix} X_{sub} \\ Y_{sub} \end{bmatrix} = \begin{bmatrix} X_{sub} \\ Y_{sub} \end{bmatrix}. \quad \text{(Equation 8)}$$

As shown in equation 8, the inverted mixing matrix ("de-mixing matrix" or "decoupling matrix") D negates the effects of the mixing matrix T, resulting in values of $X_{cor}$ that are substantially the same as the values of $X_{sub}$, and values of $Y_{cor}$ that are substantially the same as $Y_{sub}$.

Figure 6:
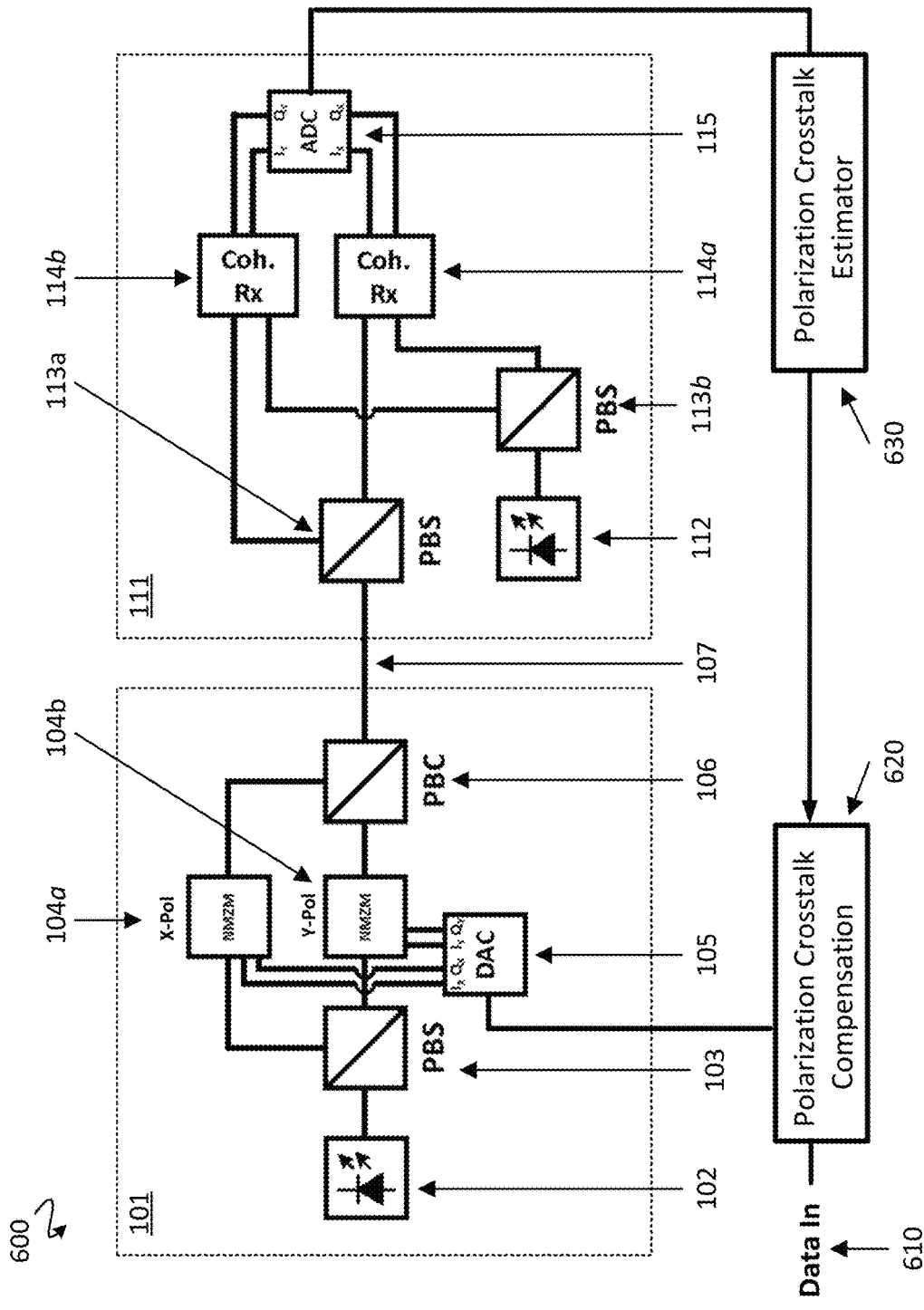
FIG. 6 is a simplified schematic diagram of a dual-polarization optical transmission system with polarization crosstalk compensation.

FIG. 6 shows a transmission system capable of performing pre-compensation of crosstalk and/or power imbalance (e.g., as described in method 500). The system 600 in FIG. 6 can include some of the same components shown in the system 100 (FIG. 1), e.g., the transmitter 101, transmission link 107, and receiver 111, as described above. However, the system 600 further includes a polarization crosstalk compensation element 620 and a polarization crosstalk estimator 630. The polarization crosstalk estimator 630 analyzes the digital representations from the ADC 115 to generate the crosstalk and/or power imbalance mixing matrix. In some embodiments, the polarization crosstalk estimator 630 cross-correlates test received digital representations with the known digital representations to generate a mixing matrix (e.g., as described in step 506 of method 500). The polarization crosstalk estimator 630 then sends the mixing matrix information to the polarization crosstalk compensation element 620. The polarization crosstalk compensation element 620 inverts the mixing matrix to generate a de-mixing matrix, and then the de-mixing matrix is applied to subsequent digital representations (e.g., Data In 610) to generate pre-compensated digital representations. These pre-compensated digital representations are then sent to the DAC 105, which converts the pre-compensated digital representations into two in-phase-and-quadrature (IQ) analog signals (IxQx and $I_yQ_y$), which are provided to the NMZMs 104a-b.

In some embodiments, the system shown in FIG. 6 contains additional components to correct for the power imbalance between the different polarizations within the transmitter 101. In some embodiments, the modulated optical signals output by the NMZMs 104a-b can be sampled to measure the power in each polarization (e.g., using photodiodes) before being recombined at the PBC 106. Attenuators can also be placed after the NMZMs 104a-b and before the PBC 106 to adjust the amount of power in each polarization. For example, the measured power in each polarization can be processed by a power imbalance estimator, and the power imbalance estimator can send information to the attenuators to adjust and balance the amount of power in each polarization.

The crosstalk and/or power imbalance pre-compensation systems and methods described herein have advantages over a system where crosstalk and/or power imbalance correction is performed as post-compensation using linear operations at the receiver. Linear operations are effective at correcting crosstalk and/or power imbalance distortions occurring at the transmitter (e.g., polarization crosstalk arising from the imperfect polarization splitting at the PBS); however, non-linear distortions (e.g., from the NMZMs) cannot be corrected for using linear operations. The result is that post-compensation using linear operations at the receiver are inferior, because other nonlinear effects prevent the effective correction of the linear crosstalk and/or power imbalance distortions. In contrast, the crosstalk and/or power imbalance pre-compensation systems and methods described herein operate in the signal chain before the nonlinear distortions have occurred and therefore can more effectively correct for the crosstalk and/or power imbalance distortions.

In some embodiments, systems and methods can correct the crosstalk and/or power imbalance using the pre-compensation methods and systems described herein, and the nonlinear distortions using additional components and method steps. The systems and methods for correcting nonlinear distortions will now be described. The term "correcting" as used herein, refers to reducing, mitigating or eliminating imperfections affecting the signal in its generation, or reception, or both, or impairments affecting the signal on the course of its transmission through the channel.

In accordance with some embodiments, the nonlinear distortion correction system can digitally filter digital time discretized data representing a signal (e.g., in communication systems as a series of symbols, but more generally as a series of signal samples) impaired by memory and nonlinear distortions. In some embodiments, the nonlinear distortion correction system contains one or more nonlinear system elements capable of applying nonlinear transformations with or without memory to the signal to correct for the nonlinear distortions. The nonlinear system element can transform a signal by a continuous nonlinear function, or a nonlinear function that is piece-wise linear, or a nonlinear polynomial, or a piece-wise nonlinear polynomial. In some embodiments, the nonlinear function is quadratic, cubic, quartic, higher degree (i.e., $5^{th}$, $6^{th}$, $7^{th}$, or greater than $4^{th}$ degree), logarithmic, exponential, sinusoidal, inverse-sinusoidal, or sigmoidal. The nonlinear element can also transform a signal using a look-up-table (LUT).

In some embodiments, the nonlinear distortion correction system contains a concatenation or series of alternating linear systems elements (e.g., filters) and nonlinear system elements (e.g., elements that apply nonlinear transformations to signals). An example of the linear system element is a linear tapped delay line (TDL). An example of the nonlinear system element is a filter that transforms a signal by a nonlinear transformation, as described above. The linear filters and nonlinear transformations can compensate for the linear impairments and linear memory effects (e.g., intersymbol interference, adjacent consecutive symbol interactions, or signal states in surrounding adjacent time instants affecting a given signal state), as well as for the nonlinear distortions. The system including linear filters and nonlinear transformations can also compensate for nonlinear distortions including memory effects, if present. The nonlinear distortion correction system can be implemented to correct the imperfections or impairments due to the effects of memory, linear distortion and nonlinear distortion in optical transmission systems that also contain the crosstalk and/or power imbalance pre-compensation methods and systems described herein.

The nonlinear distortion correction systems described above can be applied to a signal before transmission to pre-compensate for the memory, linear and nonlinear effects in the optical transmission system, or be applied to a signal after transmission to compensate for the memory, linear and nonlinear effects in the optical transmission system. In some embodiments, the parameters used by the nonlinear distortion correction system (e.g., the coefficients used in the nonlinear equations, and/or the TDL tap weights used) are arrived at with a numerical optimization procedure. An advantage of the nonlinear distortion correction systems and methods described herein are that the systems and methods can be implemented to correct signals with memory, linear impairments and nonlinear distortions without significantly increasing the complexity of the system or the number of required computations. A particular advantage in practical implementation of the methods and systems described above is that of relying on low complexity solutions, with lower than exponential complexity. In some cases the methods and systems described above rely on linear complexity. Specifically, in some cases, the nonlinear correction can, extricated from the linear filtering (either including the crosstalk, or MIMO processing, or including those), be implemented in a single, or multiple stages interlaced with other linear filters in the implementation.

In some embodiments, the nonlinear distortion correction system contains one or more linear and/or nonlinear system elements (e.g., TDLs, nonlinear filters, and/or LUTs), which contain coefficients that are used to define the tap weights, linear transformations and/or nonlinear transformations applied by each of the elements. In some embodiments, the coefficients used by the linear system elements and nonlinear systems elements can be determined by inputting a known input signal with symbols that are affected by linear and nonlinear distortions, with memory effects, into the nonlinear distortion correction system to produce an affected signal. The coefficients used by the linear system elements and/or nonlinear systems elements can be varied to minimize the error between the affected signal (i.e., the output of the nonlinear distortion correction system) and the unaffected known input signal. Various methods of optimization of the coefficients, such that the overall distortion is minimized, can be used in conjunction with the systems described.

In some embodiments, the method 500 can include one or more steps for correcting nonlinear distortions with memory. In some embodiments, the correction of the nonlinear distortions with memory occurs between steps 505 and 506. For example, the test received digital representations generated in step 505 can include nonlinear distortions with memory (i.e., that are caused by one or more components in the transmission system), and the coefficients used by the elements of the nonlinear distortion correction system can be varied to minimize the error between the test received digital representations generated in step 505 and the known digital representations of test excitation signals generated in step 501. This nonlinear distortions with memory error minimization can be performed on each polarization separately, and the mixing matrix to correct for the polarization crosstalk is generated after the nonlinear distortions with memory are corrected.

In some embodiments, the coefficients used by the linear system elements and/or nonlinear systems elements can be determined at system initialization, and/or periodically throughout the system operation. In some embodiments, the coefficients used by the linear system elements and/or nonlinear system elements can be determined after a predetermined number of symbols have been filtered (e.g., greater than 10, or greater than 1000, or greater than $10^6$, or from 10 to $10^4$, or from 10 to $10^6$, or from 10 to $10^9$).

In some embodiments, the components of the nonlinear distortion correction system can be incorporated into elements 620 and/or 630 in the system 600 shown in FIG. 6. For example, the one or more nonlinear system elements capable of applying nonlinear transformations with or without memory to the signal to correct for the nonlinear distortions can be incorporated into elements 620 and/or 630 in the system 600 shown in FIG. 6. Alternatively, the concatenation or series of alternating linear systems elements (e.g., filters) and nonlinear system elements (e.g., elements that apply nonlinear transformations to signals) can be incorporated into elements 620 and/or 630 in the system 600 shown in FIG. 6.

In some embodiments, the first and second test received digital representations (e.g., as described in step 505 of method 500) are affected by one or more nonlinear distortions with memory effects, and the one or more nonlinear distortions are corrected using a nonlinear distortion correction system after step 505 and before step 506 in method 500. In some cases, the nonlinear distortions that occur within a transmission system are caused by the optical modulator, or by an optical modulator driver amplifier.

Figure 7B:
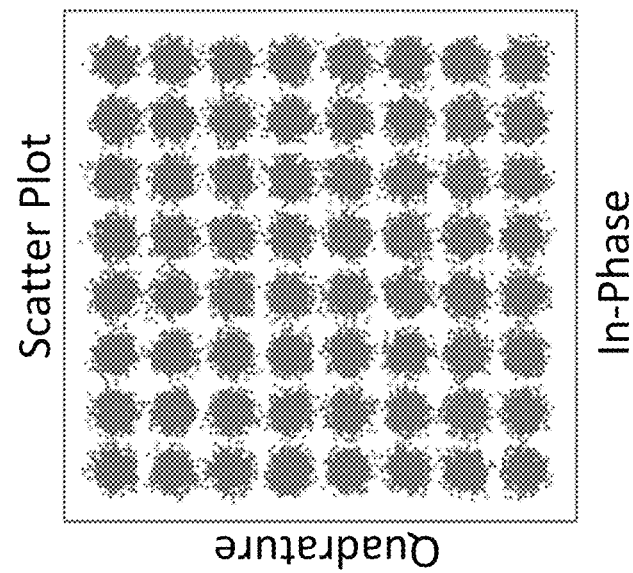
FIG. 7B shows a simplified constellation diagram corresponding to a polarized signal after correction.
Figure 7A:
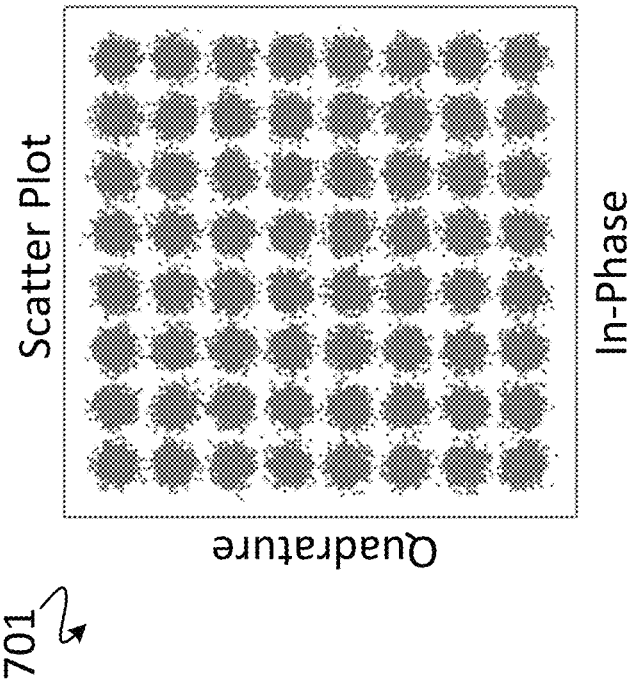
FIG. 7A shows a simplified constellation diagram corresponding to a polarized signal after correction.

FIG. 7A shows a simplified constellation diagram 701 corresponding to an X-polarized signal, and FIG. 7B shows a simplified constellation diagram 702, corresponding to a Y-polarized signal. Constellation diagram 701 and constellation diagram 702 result from crosstalk and power-imbalance correction having been performed using the process 500. In other embodiments, all or a portion of the method in 500 can be used for crosstalk and power-imbalance correction. As shown, the effects of crosstalk and power-imbalance that was shown in the constellation diagram 301 and the constellation diagram 302 have been substantially corrected, thus returning the constellation diagrams to a square shape with desirable equal vertical and horizontal spacing.

Figure 8:
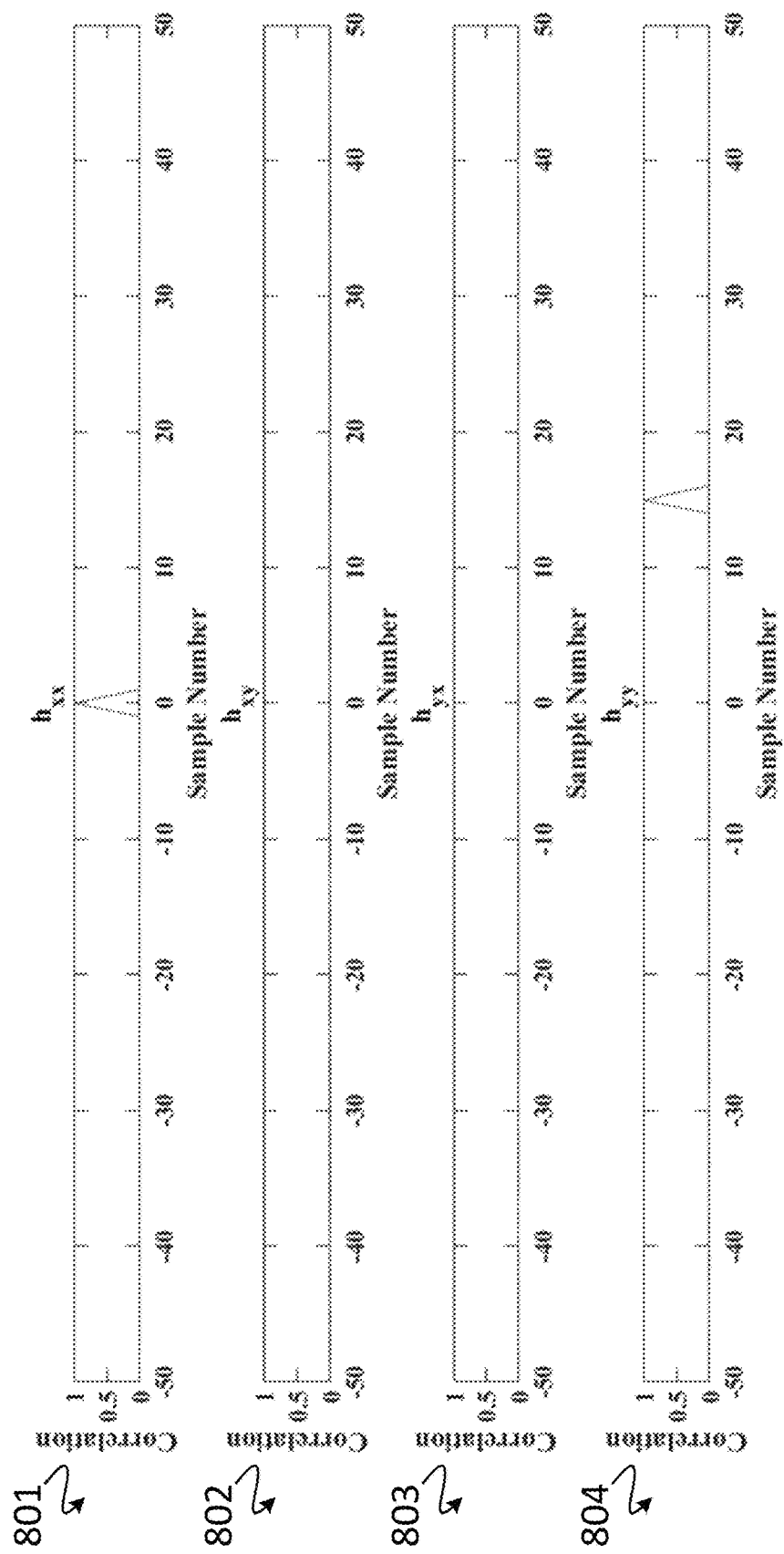
FIG. 8 shows simplified graphs of cross-correlations between generated and received digital representations after correction.

FIG. 8 shows simplified graphs of cross-correlations between generated and received digital representations after correction using all or a portion of the process 500. Graph 801 through graph 804 show excerpts of cross-correlations as were described for graph 401 through 404 of FIG. 4. However, due to the correction of the effects of crosstalk and power-imbalance, graph 802 shows little to no amplitude in the cross-correlation between $X_{cor}$ and $Y_{sub}$. Likewise, graph 803 shows little or no amplitude in the cross-correlation between $Y_{cor}$ and $X_{sub}$. This indicates that the X-polarization and Y-polarization of the transmitted signals has been restored to (or close to) strict orthogonality.

Figure 9:
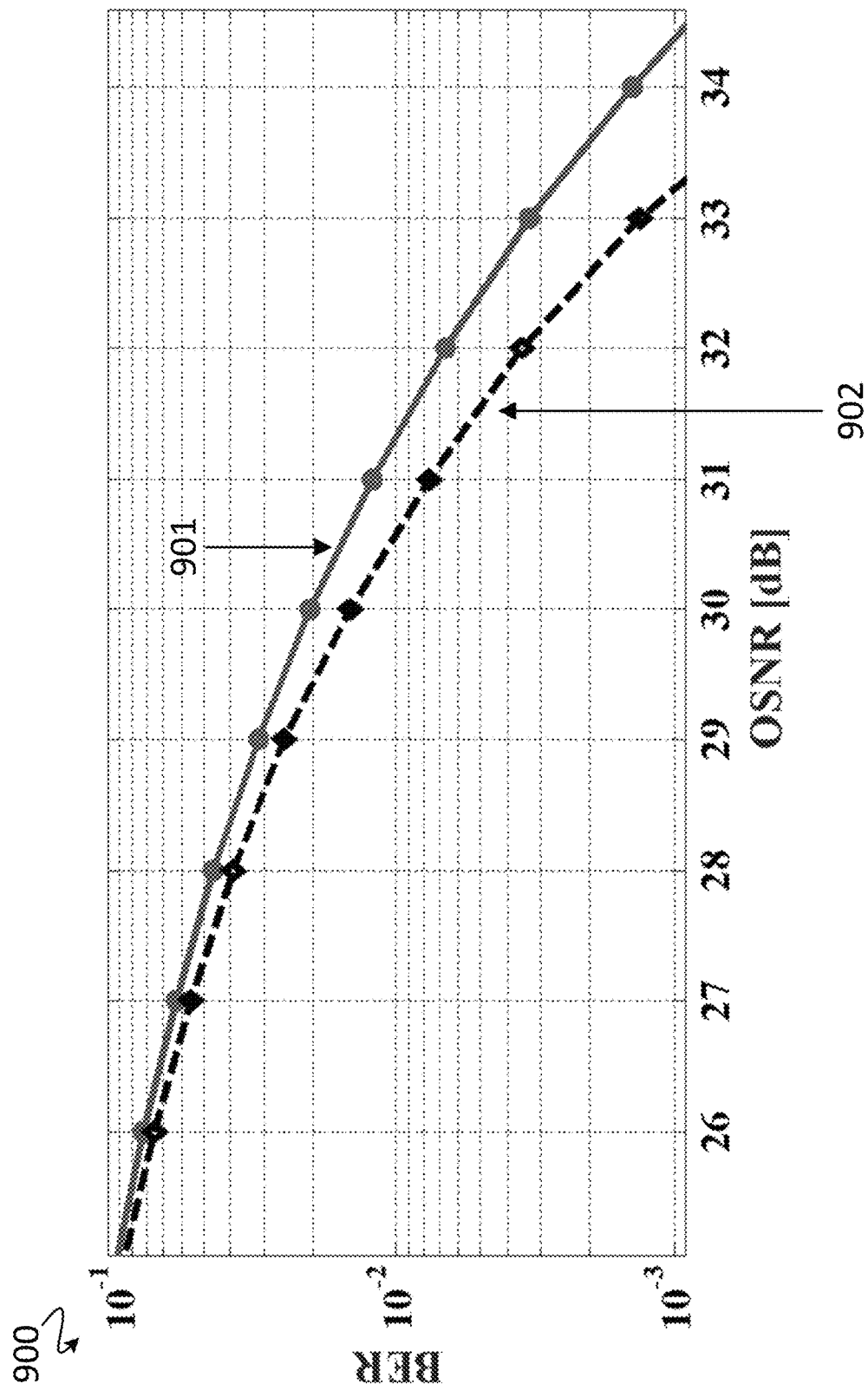
FIG. 9 shows simplified graphs of the quantitative performance of a dual-polarization system before and after correction.

FIG. 9 shows simplified graphs 900 of the quantitative performance of a dual-polarization system before and after correction. The simplified graphs 901 and 902 illustrate the performance of a 300 Gb/s dual-polarization 64-QAM system in terms of the bit-error-ratio (BER) vs. the optical signal to noise ratio (OSNR). The graph 901 shows the performance of the native system having polarization power-imbalance and crosstalk, whereas the graph 902 shows the performance of the same system with correction using all or a portion of the process 500 (or a process similar to the process 500), which achieves polarization power balancing and de-coupling. About 1 dB of performance is gained in the given example, for the system considered, as indicated by having the same BER at a lower OSNR for the graph 902 than for the graph 901.

In accordance with some embodiments, polarization power-imbalance alone (e.g. without polarization crosstalk) can be corrected. In accordance with some embodiments, polarization crosstalk, irrespective of the power-imbalance, can be compensated/inverted (e.g. corrected). In accordance with some embodiments, crosstalk and power-imbalance in integrated multi-channel transmitters can be corrected jointly, or simultaneously on all channels pertinent to a single transmitter module.

In accordance with some embodiments, crosstalk can be corrected at multiple-input-multiple-output (MIMO) bases by matrix inversion of the overall transmitter response including the polarization crosstalk and imbalance, as well as in-phase and quadrature imbalance and crosstalk of the signals in each of the polarizations. In some cases, these methods can also be combined with mitigation of the nonlinear distortion caused by transmitter and receiver components.

In accordance with some embodiments, the polarization crosstalk can be corrected assuming no memory effects in the system response (e.g. instantaneous system response, or a single-tap filter). In accordance with some embodiments, crosstalk can be corrected considering memory effects in the transmitter response.

In accordance with some embodiments, correction can include correcting nonlinear crosstalk (with, or without memory effects).

In accordance with some embodiments, crosstalk correction can be based on model-based parameters (e.g., not based on algebraic/matrix manipulations). In such model-based approaches, the crosstalk and/or power imbalance corrections do not rely on the measurement of test signals, but rather employ predetermined analytical relationships.

In accordance with some embodiments, response acquisition (used for later equalization of the crosstalk and power-imbalance) is performed once, or periodically, by means of training sequences, pilot symbols, etc.

In accordance with some embodiments, the correction approach (e.g. process) and its action, or system response used for compensation can be varied in time e.g. based on the ambient variations—acquired/communicated externally.

In accordance with some embodiments, crosstalk (e.g. the coupling coefficients) and power balancing can be determined by solving an N by N problem, where N denotes the number of transmitter output ports (e.g. 4). In accordance with some embodiments, crosstalk (e.g. the coupling coefficients) and power balancing can be determined by solving an over-determined least squares problem, instead of N by N problem, where N denotes the number of transmitter output ports (e.g. 4).

In accordance with some embodiments, crosstalk (e.g. the coupling coefficients) can be determined by a variation of a stochastic gradient method, and after its satisfactory convergence.

In accordance with some embodiments, crosstalk coefficients can be determined from cross-correlation of the received and generated known signals, performed at the system initiation, and/or repeated periodically (at periodic intervals).

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A method comprising:
   i. providing a transmission system comprising a transmitter, a transmission channel, and a receiver;
   ii. providing two carrier signals;
   iii. providing first and second test known digital representations;
   iv. generating first and second analog modulated test signals by modulating the first and second test known digital representations onto the two carrier signals in the transmitter;
   v. transmitting, by the transmitter, the first and second modulated test signals over the transmission channel;
   vi. receiving, by the receiver, the first and second modulated test signals affected by crosstalk distortions;
   vii. down-converting the received first and second modulated test signals into first and second test received digital representations;
   viii. cross-correlating the first and second test received digital representations with the first and second test known digital representations to generate a mixing matrix, wherein the mixing matrix describes the crosstalk between the first and second test received digital representations;
   ix. inverting the mixing matrix to generate a de-mixing matrix;
   x. providing digital data to be encoded onto a signal and transmitted by the transmitter; and
   xi. pre-compensating the digital data using the de-mixing matrix in the transmitter;
   wherein:
   the modulating the first and second test known digital representations onto the two carrier signals in the transmitter comprises:

splitting a laser source into the two carrier signals using a polarization beam splitter (PBS), wherein the two carrier signals have different polarizations;
   converting the first and second test known digital representations into first analog and second analog electrical signals using a multichannel digital-to-analog converter (DAC); and
   imprinting the first and second analog electrical signals onto the first and second carrier signals using first and second Mach-Zender modulators (MZMs);
   the crosstalk distortions include distortions that occur between channels of the multichannel DAC, and the crosstalk distortions that occur between channels of the multichannel DAC include memory effects;
   the crosstalk distortions include distortions that occur in the polarizing beam splitter due to imperfect polarization separation of the laser source; and
   the mixing matrix comprises coupling coefficients, wherein the coupling coefficients have dimensions such that the pre-compensating the digital data using the de-mixing matrix compensates for the crosstalk distortions including the crosstalk distortions with memory effects.

2. The method of claim 1, wherein the cross-correlating is performed by one of: solving an N by N problem, solving an over-determined least squares problem, and a stochastic gradient method.

3. The method of claim 1, wherein the cross-correlating is performed at one of: a system initiation and periodic intervals.

4. The method of claim 1, wherein the transmission channel is a fiber-optic channel.

5. The method of claim 1, wherein the crosstalk distortions include distortions that are caused by interactions between the first and second modulated test signals within the transmission channel.

6. The method of claim 1, wherein:
   the first and second test received digital representations are affected by one or more nonlinear distortions with memory effects; and the method further comprises:
   correcting the one or more nonlinear distortions using a nonlinear distortion correction system after step vii and before step viii.

7. The method of claim 6, wherein:
   the nonlinear distortion correction system contains one or more nonlinear system elements, which apply nonlinear transformations with memory to correct for the one or more nonlinear distortions.

8. The method of claim 6, wherein the the nonlinear distortions are caused by the first and second MZMs.

9. The method of claim 7, further comprising:
   providing a second set of coefficients that are used to define the nonlinear transformations applied by each of the nonlinear system elements; wherein
   the correcting the one or more nonlinear distortions using the nonlinear distortion correction system comprises varying the second set of coefficients to minimize the error between the first and second test received digital representations affected by one or more nonlinear distortions with memory effects and the first and second test known digital representations.

10. A method comprising:
A. performing a pre-compensation method for a transmission system by:
   i. generating a first optical carrier signal;
   ii. splitting the first optical carrier signal into first and second test polarized signals that are orthogonal to each other and that have in-phase and quadrature components using a polarization beam splitter (PBS);
   iii. generating known digital representations ($X_{gen}$ and $Y_{gen}$) of test excitation signals, each having an in-phase and quadrature representation;
   iv. generating test modulation analog signals from the known digital representations ($X_{gen}$ and $Y_{gen}$) using a multichannel digital-to-analog converter (DAC);
   v. modulating the in-phase and quadrature components of the first and second test polarized signals with the test modulation analog signals using first and second Mach-Zender modulators (MZMs) to form first and second modulated test polarized signals;
   vi. combining the first and second modulated test polarized signals to generate a test dual-polarization signal;
   vii. transmitting the test dual-polarization signal through a transmission channel;
   viii. receiving the test dual-polarization signal, wherein the received test dual-polarization signal is affected by crosstalk distortions;
   ix. splitting the test dual-polarization signal into first and second received test polarized signals;
   x. down converting the first and second received test polarized signals to generate down converted test analog signals;
   xi. digitizing the down converted test analog signals to generate test received digital representations ($X_{rec}$ and $Y_{rec}$);
   xii. cross-correlating the test received digital representations ($X_{rec}$ and $Y_{rec}$) with the known digital representations ($X_{gen}$ and $Y_{gen}$) to generate a mixing matrix; and
   xiii. inverting the mixing matrix to generate a de-mixing matrix; and
B. transmitting data by the transmission system by:
   i. generating a second optical carrier signal;
   ii. splitting the second optical carrier signal into first and second data polarized signals that are orthogonal to each other and that have in-phase and quadrature components using the PBS;
   iii. generating, from data to be transmitted, subsequent digital representations ($X_{sub}$ and $Y_{sub}$) of data analog signals;
   iv. applying the de-mixing matrix to the subsequent digital representations ($X_{sub}$ and $Y_{sub}$) to generate pre-compensated digital representations ($X_{pre-comp}$ and $Y_{pre-comp}$);
   v. generating pre-compensated modulation analog signals from the pre-compensated digital representations ($X_{pre-comp}$ and $Y_{pre-comp}$) using the multichannel DAC;
   vi. modulating the in-phase and quadrature components of the first and second data polarized signals with the pre-compensated modulation analog signals using the first and second MZMs to form first and second modulated pre-compensated polarized signals;
   vii. combining the first and second modulated pre-compensated polarized signals to generate a pre-compensated dual-polarization signal;
   viii. transmitting the pre-compensated dual-polarization signal through the transmission channel;
   ix. receiving the pre-compensated dual-polarization signal;
   x. splitting the pre-compensated dual-polarization signal into first and second received pre-compensated polarized signals;
   xi. demodulating the first and second received pre-compensated polarized signals to generate demodulated corrected analog signals;
   xii. digitizing the demodulated corrected analog signals to generate corrected received digital representations ($X_{cor}$ and $Y_{cor}$), wherein the corrected received digital representations ($X_{cor}$ and $Y_{cor}$) substantially match the subsequent digital representations ($X_{sub}$ and $Y_{sub}$); and
   xiii. retrieving the data to be transmitted from the corrected received digital representations ($X_{cor}$ and $Y_{cor}$);
wherein:
the crosstalk distortions include distortions that occur between channels of the multichannel DAC, and the crosstalk distortions that occur between channels of the multichannel DAC include memory effects;
the crosstalk distortions include distortions that occur in the polarizing beam splitter due to imperfect polarization separation of the first and second optical carrier signals; and
the mixing matrix comprises coupling coefficients, wherein the coupling coefficients have dimensions such that the pre-compensating the subsequent digital representations ($X_{sub}$ and $Y_{sub}$) using the de-mixing matrix compensates for the crosstalk distortions including the crosstalk distortions with memory effects.

11. The method of claim 10, wherein the crosstalk distortions include distortions that are caused by interactions between different polarizations of the dual-polarization signal within the transmission channel.

12. The method of claim 10, wherein the transmission channel is a fiber-optic channel.

13. The method of claim 10, wherein the cross-correlating is performed by one of: solving an N by N problem, solving an over-determined least squares problem, and a stochastic gradient method.

14. The method of claim 10, wherein:
the test received digital representations ($X_{rec}$ and $Y_{rec}$) are affected by one or more nonlinear distortions with memory effects; and the method further comprises:
correcting the one or more nonlinear distortions using a nonlinear distortion correction system after step A-xi and before step A-xii.

15. The method of claim 14, wherein:
the nonlinear distortion correction system contains one or more nonlinear system elements, which apply nonlinear transformations with memory to correct for the one or more nonlinear distortions.

16. The method of claim 14, the nonlinear distortions are caused by the first and second MZMs.

17. The method of claim 15, further comprising:
providing a second set of coefficients that are used to define the nonlinear transformations applied by each of the nonlinear system elements; wherein
the correcting the one or more nonlinear distortions using the nonlinear distortion correction system comprises varying the coefficients to minimize the error between the test received digital representations ($X_{rec}$ and $Y_{rec}$)

affected by one or more nonlinear distortions with memory effects and the known digital representations ($X_{gen}$ and $Y_{gen}$).

\* \* \* \* \*